（12） United States Patent
Charles, Jr. et al.

US006977381B2

(10) Patent No.: US 6,977,381 B2
(45) Date of Patent: Dec. 20, 2005

(54) GATING GRID AND METHOD OF MAKING SAME

(75) Inventors: Harry K. Charles, Jr., Columbia, MD (US); Arthur S. Francomacaro, Eldersburg, MD (US); Allen C. Keeney, Reisterstown, MD (US); David M. Lee, Hanover, PA (US); Timothy J. Cornish, Catonsville, MD (US)

(73) Assignee: The Johns Hopkins University, Baltimore, MD (US)

( * ) Notice: Subject to any disclaimer, the term of this patent is extended or adjusted under 35 U.S.C. 154(b) by 390 days.

(21) Appl. No.: 10/451,860

(22) PCT Filed: Jan. 29, 2003

(86) PCT No.: PCT/US03/02488

§ 371 (c)(1),
(2), (4) Date: Jun. 25, 2003

(87) PCT Pub. No.: WO03/065763

PCT Pub. Date: Aug. 7, 2003

(65) Prior Publication Data

US 2004/0231150 A1 Nov. 25, 2004

Related U.S. Application Data

(60) Provisional application No. 60/352,957, filed on Jan. 30, 2002.

(51) Int. Cl.[7] ............................. H01J 1/46; H05K 3/06
(52) U.S. Cl. ................................. 250/396 R; 29/846
(58) Field of Search ...................... 250/396 R; 29/846

(56) References Cited

U.S. PATENT DOCUMENTS

| 4,164,059 A | 8/1979 | Van Esdonk |
| 4,633,083 A | 12/1986 | Knorr et al. |
| 5,021,654 A | 6/1991 | Campbell et al. |

(Continued)

OTHER PUBLICATIONS

PCT Intl. Search Report, PCT/US03/02488, mailed May 27, 2003.
200-DF4/DF5 Functional Description, Nov. 14, 2002, www.fnrf.science.cmv.ac.th.
ES-MS—Thermal and Low Energy Electron Attachment: Rate Coefficients and Anion Products, Nov. 13, 2002, www.sr.gham.ac.uk.
Hadamard Transform Time-of-Flight Mass Spectrometry: A High Speed Detector for Capillary-Format Separations, Analytical Chemistry, Jan. 18, 2002, by Fernandez et al.

(Continued)

*Primary Examiner*—Evan Pert
(74) *Attorney, Agent, or Firm*—Albert J. Fasulo, II

(57) ABSTRACT

A gating grid for deflecting ions includes an insulating substrate (16), a conducting layer (28) adhered to the insulating substrate (16), and interdigitated electrodes (14) patterned in the conducting layer by a photolithographic process. A hole ( 18) in the insulating substrate beneath the interdigitated electrodes allows ions to pass through the hole in the substrate. A process for making a gating grid for deflecting ions includes adhering a conducting layer (28) to an insulating substrate (16), forming interdigitated electrodes (14) on the conducting layer (28), and then forming a hole (18) in the insulating substrate beneath the interdigitated electrodes.

19 Claims, 6 Drawing Sheets

U.S. PATENT DOCUMENTS

| | | |
|---|---|---|
| 5,465,480 A | 11/1995 | Karl et al. |
| 5,652,083 A | 7/1997 | Kumar et al. |
| 5,986,258 A | 11/1999 | Park |
| 6,051,832 A | 4/2000 | Bradshaw |
| 6,238,581 B1 | 5/2001 | Hawkins et al. |
| 6,281,109 B1 | 8/2001 | Ma et al. |
| 6,406,927 B2 | 6/2002 | Derraa |
| 6,469,296 B1 | 10/2002 | Hansen et al. |
| 2002/0125420 A1 | 9/2002 | Park |

OTHER PUBLICATIONS

Novel Method for the Production of Finely Spaced Bradbury-Nielson Gates, Review of Sceintific Instruments vol. 72 #12, Dec. 2001, by Kimmel et al.

Characterization of a Hadamard Transform Time-of-Flight Mass Spectrometer, Review of Scientific Instruments, vol. 71, #3, Mar. 2000, by Brock et al.

GATING GRID AND METHOD OF MAKING SAME

CROSS-REFERENCE TO RELATED APPLICATION

This application claims the benefit of the now abandoned U.S. Provisional Patent Application No. 60/352,957, filed on Jan. 30, 2002, and herein incorporated by reference.

BACKGROUND OF THE INVENTION

1. Technical Field

The present invention relates to a gating grid for deflecting ions and a method of making same.

2. Description of the Related Art

Diverting the path of high-speed charged particles is important in many areas of applied physics. Scanning Electron Microscopes (SEMs) use deflection plates parallel to an electron beam to steer electrons across a surface to develop an image. Similarly ion implanters used in the manufacture of microchips also employ charged plates to steer dopant atoms to desired locations on a chip. In both of these applications capacitively charged plates apply electromagnetic normal forces to high-speed charged particles to divert or steer the path of the particles.

Bradbury-Nielson (B-N) gates were first invented in 1936 and were used as electron filters. Similar to the charged plates described above, a Bradbury-Nielson gate is a gating grid that steers charged particles through the use of an electromagnetic field. However instead of employing charged plates, a B-N gate uses two interdigitated combs of wires that are electrically insulated from each other. If alternate potentials are applied to the two wire combs, a charged particle passing between two of the interdigitated wires will be pushed away from one wire and pulled toward the other, steering the particle from its initial path.

More recently B-N gates have been used to deflect ion beams in time-of-flight mass spectrometry (TOF-MS). Certain applications of TOF-MS require identifying particular packets of ions as they move through a drift tube toward a detector. If a B-N gate is placed inside such a drift tube and the charged wires are modulated between different potentials at a high frequency, desired ion packets can be selected for analysis and undesired ion packets can be discarded. For example the packets that pass through the gate when the gate is on may be diverted away from the detector, and only the ion packets that pass through the gate when the gate is off will reach the detector.

Such modulation of B-N gates is more efficient than modulating charged plates. The electromagnetic field surrounding the thin wires of a B-N gate can be made much smaller than the field surrounding two charged parallel plates. Therefore ions passing through a B-N gate spend less time exposed to its electromagnetic field and a square wave "pulse" used to modulate the field can have much sharper edges and a higher frequency. The sharp edges and high frequency (often greater than 10 MHz) of such a pulse in turn mean that the B-N gate can be more discriminating and select smaller packets of ions.

Similarly, if the spacing between the wires of a B-N gate is decreased, the required potential across the wires of the B-N gate that is needed to divert an ion packet is reduced and the modulation frequency of the gate can be further increased.

Therefore considerable efforts have been expended to minimize the spacing between wires of B-N gates. Prior art B-N gate manufacturing techniques however have involved hand manipulations of the fine wire combs. Even with advanced microscopic tools, hand manipulations of such tiny features is extremely difficult, time consuming and costly. U.S. Pat. No. 5,465,480 to Karl et al. discloses a method of manufacturing a B-N gate where the parallel fingers of the gate are cut or etched into a metal foil. The resulting metal grid is then stretched and glued to an insulating ceramic frame. Finally, the connections between the grid elements are individually severed to create the interdigitated fingers of the B-N gate.

In 2000 Brock et al. reported producing a single B-N gate with wire spacing of 0.16 mm by stretching gold-plated tungsten wires across a frame and gluing each wire in place using a polymethylacrylamide spacer. A. Brock, N. Rodriguez, and R. N. Zare, "Characterization of a Hadamard Transform Time-Of-Flight Mass Spectrometer," Review of Scientific Instruments, Vol. 71, No. 3, 1306 (2000).

In 2001 Kimmel et al. disclosed a semi-automated method of producing B-N Gates to produce spacing as small as 0.075 mm between wires and that requires around three hours to make each gate. Kimmel et al. employs a hand-cranked tool that stretches a continuous wire along a grooved polymer block. J. R. Kimmel, F. Engelke, and R. N. Zare, "Novel Method for the Production of Finely Spaced Bradbury-Nielson Gates," Review of Scientific Instruments, Vol. 72, No. 12, 4354 (2001).

Another technique for reducing the potentials required to divert ions using a B-N gate is described in U.S. Pat. No. 5,986,258 to Park. Instead of decreasing the spacing between the wires of the B-N gate, the '258 patent discloses a type of three-dimensional B-N gate employing stacked parallel deflection plates. This technique is a compromise that decreases the relatively high voltages of traditional B-N gate wires but at the cost of diminished resolution due to an extended electromagnetic field.

There is therefore a need for a more automated method of manufacturing gating grids with decreased spacing between the wires, that requires less manufacturing time per gate and that is less costly.

SUMMARY OF THE INVENTION

The present invention is therefore a gating grid for deflecting ions that includes an insulting substrate, a conducting layer adhered to the insulating substrate, and interdigitated electrodes patterned in the conducting layer by a photolithographic process. A hole in the insulating substrate beneath the interdigitated electrodes allows ions to pass between the interdigitated electrodes and through the hole in the substrate.

A process for making a gating grid for deflecting ions according to the present invention includes adhering a conducting layer to an insulating substrate, forming interdigitated electrodes on the conducting layer, and then forming a hole in the insulating substrate beneath the interdigitated electrodes.

BRIEF DESCRIPTION OF THE DRAWINGS

For a more complete understanding of the present invention and the advantages thereof, reference is now made to the following detailed description taken in conjunction with the accompanying drawings in which.

DETAILED DESCRIPTION OF THE PREFERRED EMBODIMENTS

Figure 1:
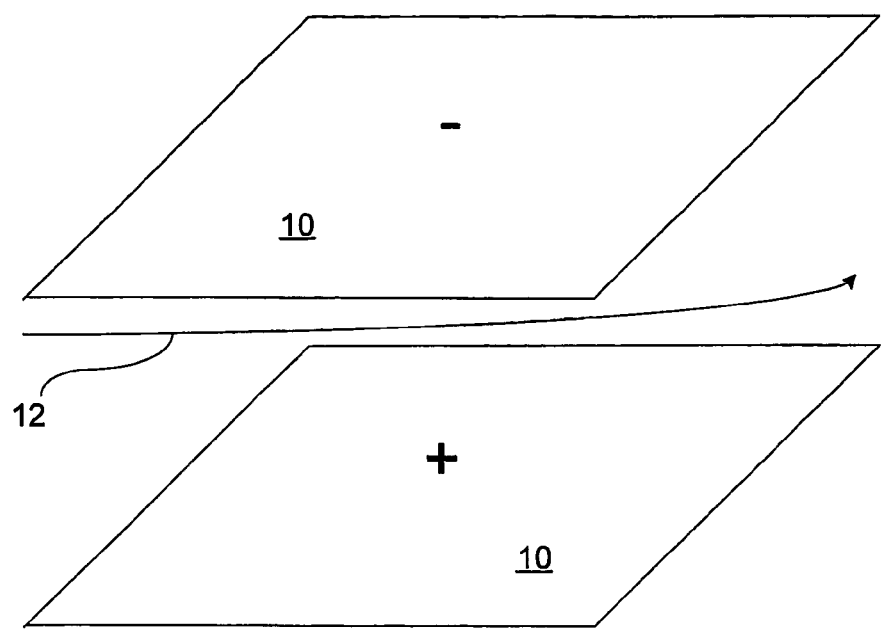
FIG. 1 is a conceptual illustration of prior art deflection plates.
Figure 2A:
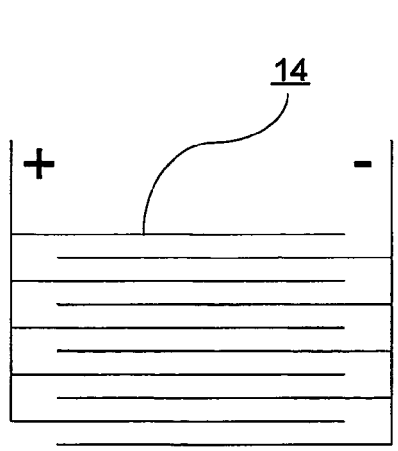
FIG. 2A is a conceptual illustration of an ion gating grid according to the prior art.
Figure 2B:
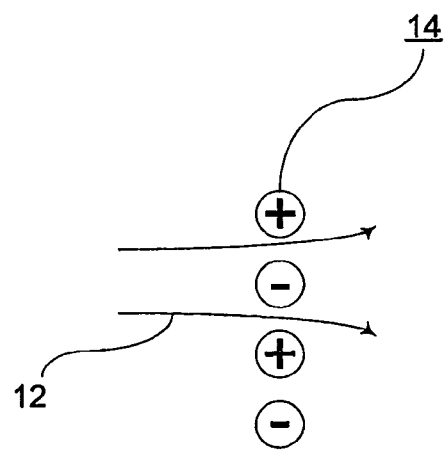
FIG. 2B is a conceptual illustration of a side view of four electrodes of an ion gating grid according to the prior art.

FIG. 1 is a conceptual illustration of prior art deflection plates 10 used to divert an ion path 12 in various instruments such as SEMs as discussed above. FIG. 2A is a conceptual illustration of an ion gating grid such as a B-N gate showing the interdigitated electrodes 14 at opposite potentials. As discussed above, prior art manufacturing techniques require the electrodes 14 to be stretched by hand across an ion path 12 and fixed to an insulating substrate. FIG. 2B is a conceptual illustration of a side view of four electrodes 14 of an ion gating grid illustrating the deflected ion path 12.

Figure 3A:
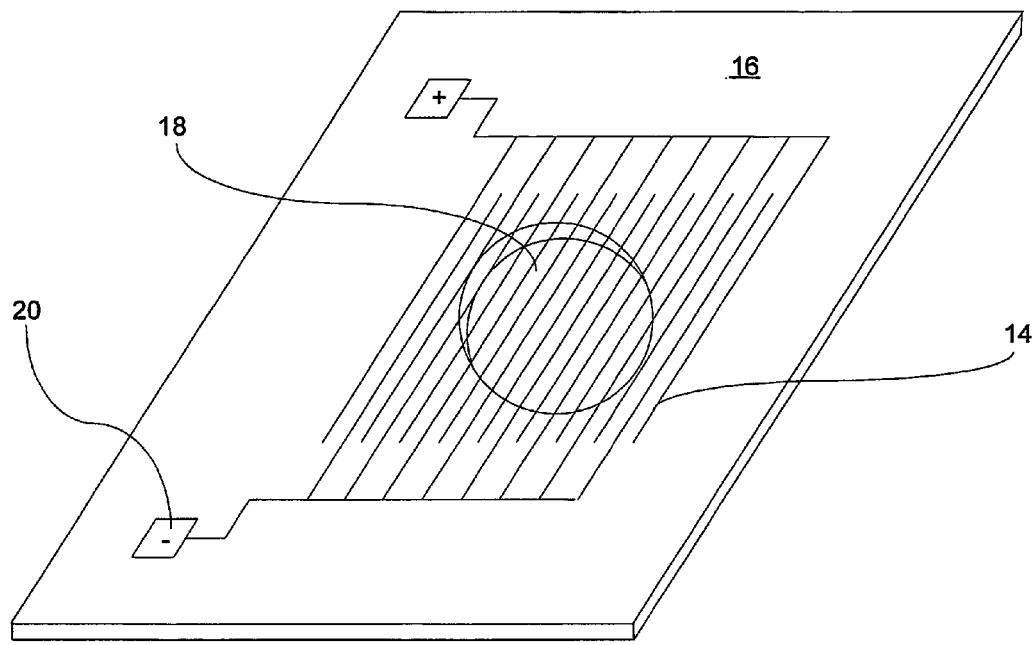
FIGS. 3A and 3B are schematic drawings of one specific embodiment of an ion gating grid according to the present invention.
Figure 3B:
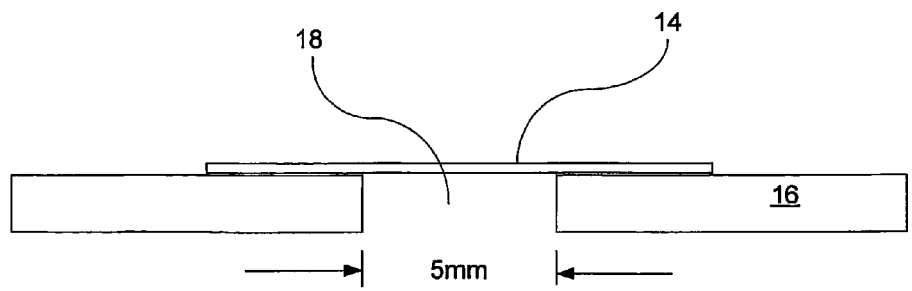

The present invention concerns improved ion gating grids made using advanced semiconductor processing techniques. As an example, schematic drawings of one specific embodiment of a gating grid made according to the present invention are shown in FIGS. 3A and 3B. The embodiment comprises a grid of electrodes 14 formed by etching a conducting layer attached to an insulating substrate 16. However, unlike prior art techniques that require careful handling of an etched metal grid as it is stretched across an opening and bonded to a substrate, the present invention involves no physical handling or manipulation of the etched electrodes 14. Instead, as illustrated in FIG. 3B, according to the present invention the insulating substrate 16 underneath the electrodes 14 is also etched to create a hole 18 that creates a pathway for ions through the insulating substrate 16.

Because the conducting layer comprising the gate electrodes 14 do not need to be subsequently handled or stretched across the supporting substrate 16, more delicate and finely spaced electrodes 14 are possible. Inexpensive mass production of the grids is also made possible because the grids do not require individual handling.

Mass production of the grids according to the present invention also enables several of the grids to be economically stacked together, as discussed in more detail below, to form three-dimensional gating grids having staggered electrodes 14 used to more precisely discriminate, select and deselect ion packets.

In the specific embodiment of the present invention shown in FIGS. 3A and 3B, the interdigitated electrodes 14 bridge the round hole 18 in the insulating substrate 16 and are alternately connected in common with one of two electrical contact pads 20. The electrodes 14 are formed from ½ oz. copper sheets that are 18 $\mu$m high and 50 $\mu$m wide, with 75 $\mu$m spacings between them. The hole 18 has a 5.0 mm diameter and is etched into the substrate 16 after the electrodes 14 are formed on the substrate 16. This embodiment may be constructed in large quantities according to the details of the batch process described below.

Figure 4A:
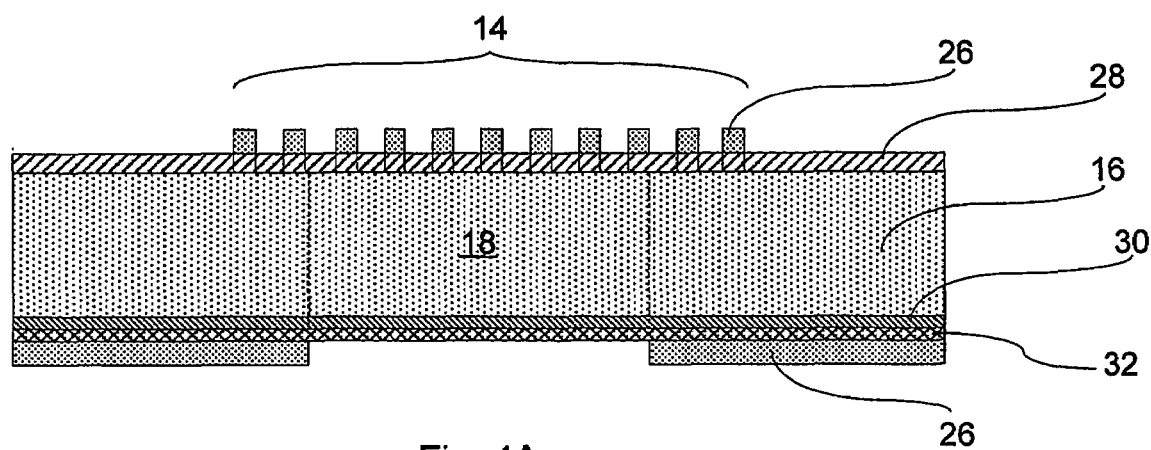
FIG. 4A is a schematic drawing illustrating different material layers used in making a specific embodiment of the present invention.
Figure 4B:
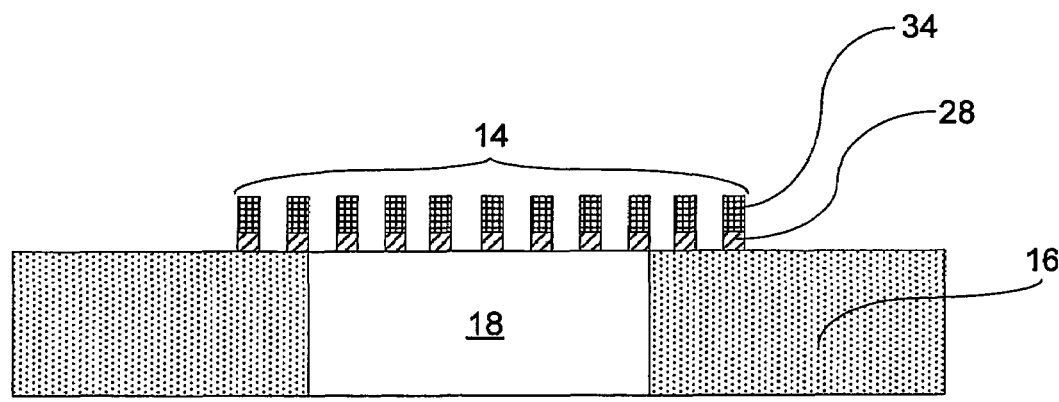
FIG. 4B is a schematic drawing illustrating three different material layers in a completed ion gating grid made according to the present invention.

FIGS. 4A and 4B are conceptual cross-sectional drawings, not shown to scale, illustrating the layered location of several of the materials used in the detailed process described below. FIG. 4A illustrates the arrangement of material layers following step three below, showing the electrodes 14 and the hole 18 patterned in photoresist 26, before the layers of copper 28, Ti/W 30, gold 32 and insulating Kapton® substrate 16 are etched to create the completed ion gating grids. FIG. 4B illustrates the material layers following step 7 below where the completed copper electrodes 14 are suspended over the hole 18 in the Kapton® substrate 16.

DETAILED EXAMPLE OF A PROCESS FOR MAKING GATING GRIDS

Step 1. Prepare Material. Begin the present process using 2-mil thick Kapton® substrate 16 with ½ ounce copper 28 on each side. Laminate both sides with a dry film photoresist 26. Expose one side and develop the photoresist 26. Etch the copper 28 off the exposed side. Then strip the photoresist 26 leaving a single layer of copper 28 on the Kapton® substrate 16.

Step 2. Apply Metal Mask. Cut the Kapton® substrate 16 into sections (~9 cm²) and tape the sections to 10 cm alumina supporting plates with the copper side down (using as little tape as possible). Place the plates into a sputtering system and sputter 600 Å (0.6 $\mu$m) of TiW 30 onto the Kapton® substrate 16. The TiW 30 enables the masling gold layer 32 to adhere to the Kapton® substrate 16. Allow to cool for at least 30 minutes and then sputter 2000 Å (0.2 $\mu$m) of gold. Again allow to cool for at least 30 minutes and then sputter another 2000 Å (0.2 $\mu$m) of gold. Then allow to cool for 30 minutes or more and deposit an additional 2000 Å (0.2 $\mu$m) of gold (forming a final gold layer 32 having a thickness of 6000 Å (0.6 $\mu$m)). Remove the alumina supporting plates.

Figure 5:
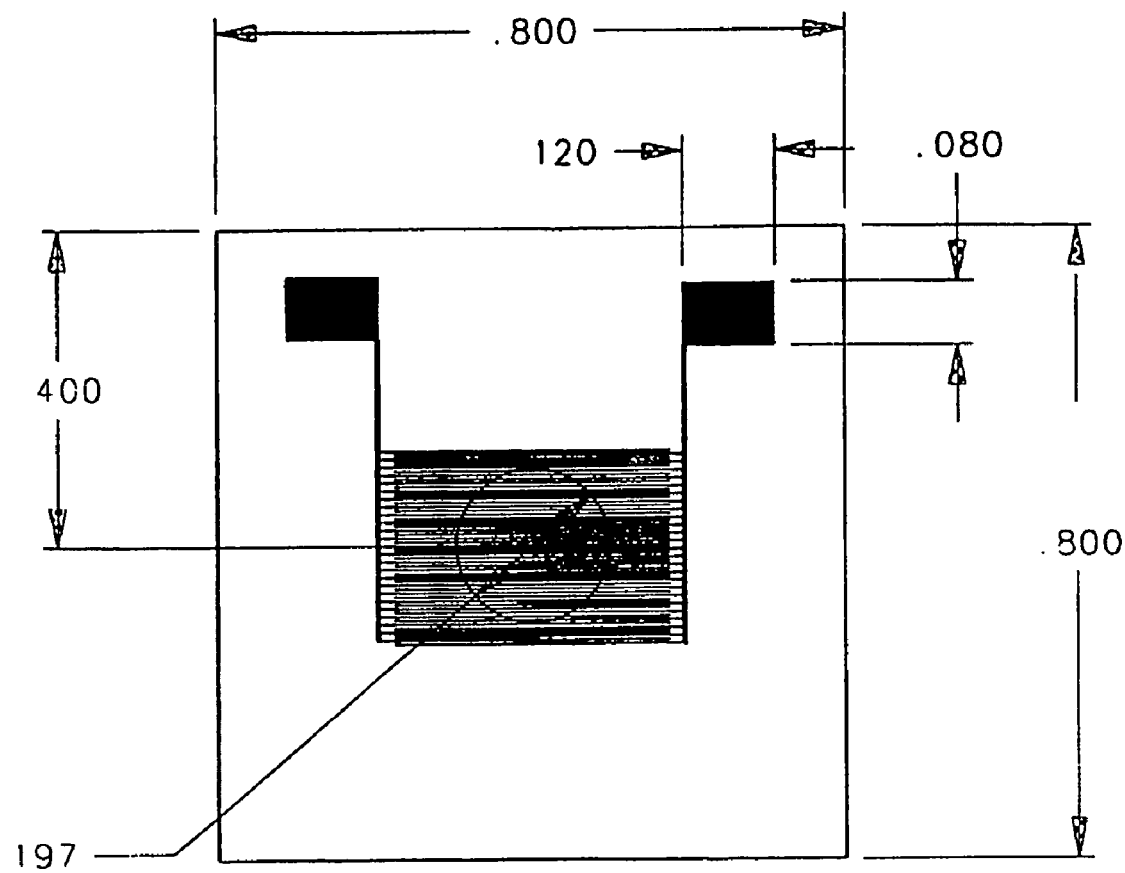
FIG. 5 is a computer-aided design blue print of a photomask used in making one embodiment of the present invention.

Step 3. Pattern Features Using Photoresist. Laminate the copper layer 28 and the gold layer 32 with dry film photoresist 26 such as Laminar AX10. Expose multiple patterns on the copper-side photoresist 26 through a photomask patterned with an interdigitated gating grid. An example of a computer-aided design blue print of one such grid pattern is shown in FIG. 5, including the electrical contact pads 20 and the interdigitated electrodes 14. The electrodes 14 shown in FIG. 5 are 50 $\mu$m wide with a 75 $\mu$M spacing between them. Expose the gold-side photoresist 26 through a photomask patterned with a large round hole 18 that will comprise the ion pathway in the completed gating grids. Allow the exposed photoresist 26 to sit for three minutes, then bake it in an oven at 95° C. for five minutes, and then allow it to cool for another three minutes. Then spray-develop the photoresist 26 at 84° C. for 50 seconds.

Step 4. Etch Metal Layers. Etch the copper layer 28 in ferric chloride spray at 100° F. for 45 to 50 seconds (until the grid pattern just clears). Rinse, dry, and inspect the etched copper layer 28. Place plating tape over the copper layer 28. Then etch the gold layer 32 in potassium iodide/iodine spray for 15 seconds. Rinse the materials and remove the tape. Strip the photoresist 26 in ADF Strip-10 at 55° C. for two minutes. Then dip in 30% hydrogen peroxide at 55° C. for 30 seconds to etch the TiW layer 30.

Step 5. Etch Kapton® Substrate. From the ~9 cm$^2$ patterned sections, cut out the gating grid patterns to be completed. Use black wax (Apiezon W) to secure the separated gating grids (copper layer 28 facing down) onto three-inch silicon wafers. Use a clean wooden stick to press lightly on the gating grids to eliminate bubbles between the copper layer 28 and the wax. Cool to room temperature. Place the gating grids in a TRION plasma etching system to etch the hole 18 in the Kapton® substrate 16. Operate the system using the polyimide etching program for 15 minutes at a time (ICP: 250 Watts; RIE: 100 Watts; $O_2$ flow: 50 sccm). Allow the system to cool between runs. Set the helium pressure to 5.0 mTorr when the RF power is on. After each 15-minute run, gently wipe the Kapton® substrate 16 with a soft swab to remove any carbonized material (black dust). After the 5$^{th}$ run (75 minutes), the Kapton® substrate 16 should be overetched by about 12 minutes and all the spaces between the grid electrodes 14 in the copper layer 28 should be clear.

Step 6. Etch Mask. Place the nearly completed gating grids under a microscope and use a paintbrush to carefully apply a thick layer of Shipley S1813 or S1822 photoresist 26 to the exposed electrodes 14 inside the center hole 18 of each substrate 16. Do not allow the photoresist 26 to touch the gold layer 32. Bake the gating grids in an oven at 95° C. for 30 minutes. Allow to cool and then etch the gold layer 32 in a cyanide-based gold etch for 90 seconds at 4020 C. Rinse in deionized water and then etch the TiW layer 30 in 30% hydrogen peroxide at 55° C. for 30 seconds. Rinse again with deionized water.

Step 7. Release Completed Gating Grids from Wax. Place the gating grids in a Petri dish and cover with trichloroethylene (TCE) to remove any residual black wax. Cover with a lid and soak for at least four hours. Then use tweezers to carefully remove the gating grids from the wax and place them in a clean solution of TCE. Soak for 15 to 30 minutes. Soak in a third TCE bath for three minutes before a three-minute acetone soak. Finally, rinse the completed gates in isopropyl alcohol and bake dry in an oven at 95° C. for ten minutes.

The above process therefore results in mass-produced ion-gating grids comprising precisely aligned and dimensioned electrodes 14. Various other features may be employed in other embodiments that should be considered to be inside the scope of the present invention.

For example, depending on the application, a gating grid may be further strengthened by gluing it to a reinforcing layer made of a stiff material such as ceramic. In such cases the reinforcing layer would also include a hole concentric with the hole 18 in the Kapton® substrate 16. The resulting composite part is easily handled for attaching lead wires to the contact pads 20 and for mounting the grid in an ion drift tube. Those skilled in the art will also recognize numerous alternative material selections and modifications to the above process that are intended to be within the scope of the present invention. For example, various metal etching processes may also be used such as glow-discharge sputtering and ion milling. The Kapton® substrate 16 could also be etched using, for example, reactive ion beam etching or high-density plasma etching. Further, in other embodiments of the present invention the electrodes 14 do not need to be straight and the hole 18 could be of any shape.

Other modifications of the above process may be made depending on the needs of specific applications. For example in some applications the gold layer 32 may not need to be removed as described in step 6 above, but could remain with the completed gating grid.

Still other modifications could concern increasing or decreasing the dimensions of the gating grid. For example, the spacing between the electrodes 14 could be reduced well below 0.075 mm. Also, the diameter of the hole 18 could be increased, however care should be taken to prevent sagging of the electrodes 14 due to the force of gravity. As the ratio of the diameter of the hole 18 and the thickness of the electrodes 14 increases, sag in the electrodes 14 may be prevented by reinforcing the electrodes 14 with a high strength metallic top layer 34 as shown in FIG. 4B.

One technique for applying a metallic top layer 34 includes modifying the above Detailed Example of a Process for Making Gating Grids. Before etching the Kapton® substrate 16 in Step 5, each individual electrode 14 is confined in a well made of photoresist walls. The edges of the photoresist walls are aligned with the edges of the electrodes 14 such that photoresist completely fills the gaps between the electrodes 14. Post-patterning electroplating is then used to plate the electrodes 14 to a desired thickness. Standard processes known in the art are used to perform the actual application and initial patterning of the photoresist. After the electrodes 14 are plated with the metallic top layer 34, the photoresist walls are removed by standard chemical stripping. Using this method, the height of the plated electrodes (i.e., the dimension parallel to the ion path 12) can be made about 3–5 times the width of the individual electrodes 14. The actual thickness of a top layer 34 is controlled by the height of the photoresist walls and the dynamic parameters of the plating process (such as the bath composition, plating voltage, electrode area, and the time of deposition). Copper and nickel plating baths are used most commonly, although other platable metals may also be used. After the metallic top layers 34 are formed, the electrodes are protected using the methods described above and the substrate hole 18 is etched.

The resulting rectangular metallic top layers 34 can improve the performance of the gating grids for certain applications. The increased height of the electrodes 14 enables the electromagnetic field to interact with individual ion packets for a longer period of time, thus causing greater deflection for a given field strength. That in turn enables the field bias voltage to be reduced for a given amount of ion deflection and allows the grid to operate with a smaller, less expensive bias power supply.

Figure 6:
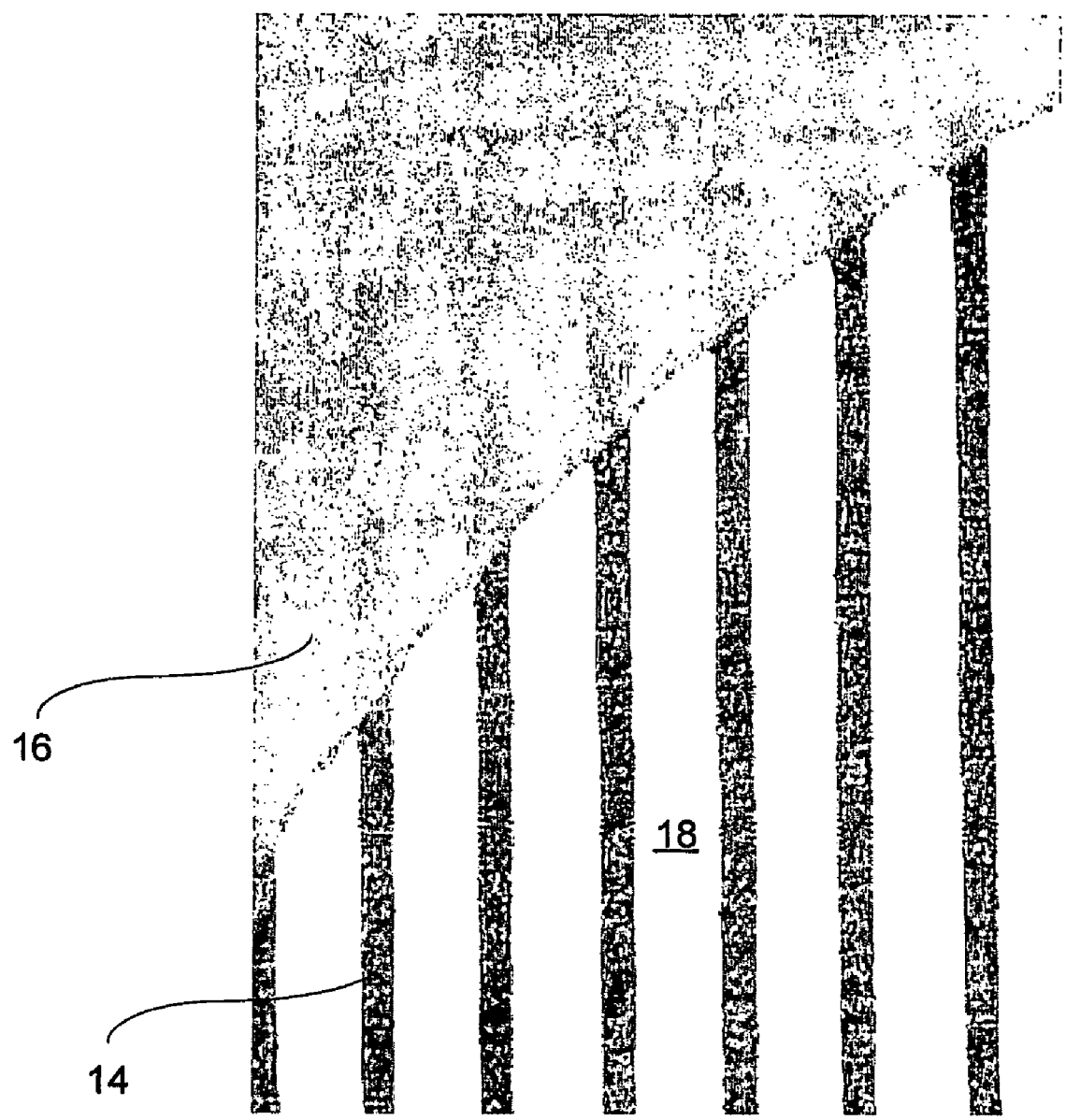
FIG. 6 is a photomicrograph of the underside of an actual gating grid made according to the present invention.

FIG. 6 is a photomicrograph of the underside of an actual gating grid formed according to the above detailed process, but without a metallic top layer 34. The figure illustrates the well-defined, parallel copper electrodes 14 bridging the hole 18 and the sharply defined Kapton® film edge around the hole 18. The figure also shows the slight transparency of the insulating Kapton® substrate 16.

Because of the precision alignment of the grid electrodes 14 that may be fabricated according to the present invention, multiple gating grids may be easily stacked adjacent one another to form a wide variety of ion pathways used for various purposes.

Figure 7A:
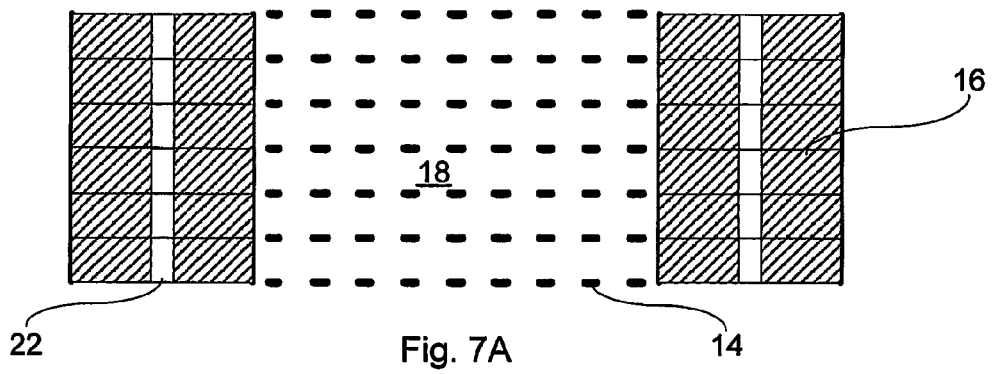
FIG. 7A is a schematic illustration of a cross section of a stacked gate pattern comprising identically patterned electrodes according to the present invention.

For example, FIG. 7A is a schematic illustration of a cross section of a stacked gate pattern comprising identically patterned electrodes 14. The substrates 16 of the different layers may be held together with epoxy, for example, or with double-sided adhesive films. According to the requirements of a particular application, the electrodes 14 for each grid can be connected in common with the electrodes 14 of adjacent grids or each grid can be powered independently. Alignment holes or vias 22 may be milled into the substrates 16 to ensure that each grid can be easily and precisely aligned with respect to adjacent grids.

Figure 7B:
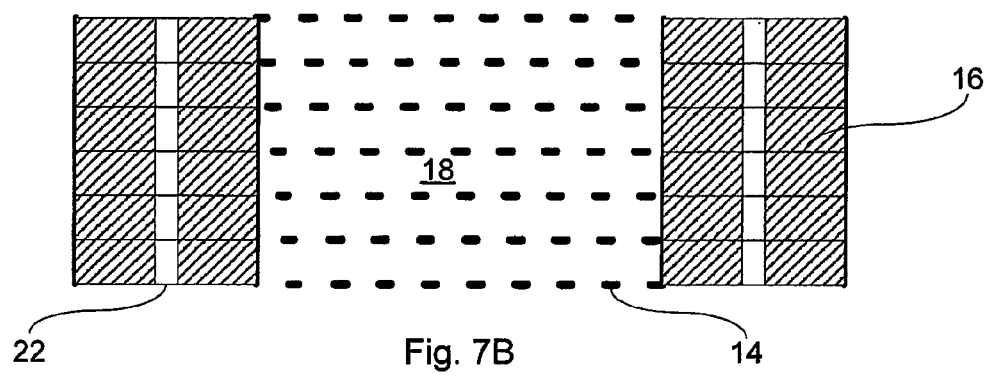
FIG. 7B is a schematic illustration of a cross section of a stacked grid pattern comprising differently patterned electrodes according to the present invention.

FIG. 7B is a schematic illustration of a cross section of a stacked grid pattern comprising differently patterned electrodes 14. When stacked together, adjacent electrodes 14 are staggered and form a louvered, non-axial ion pathway.

Figure 7C:
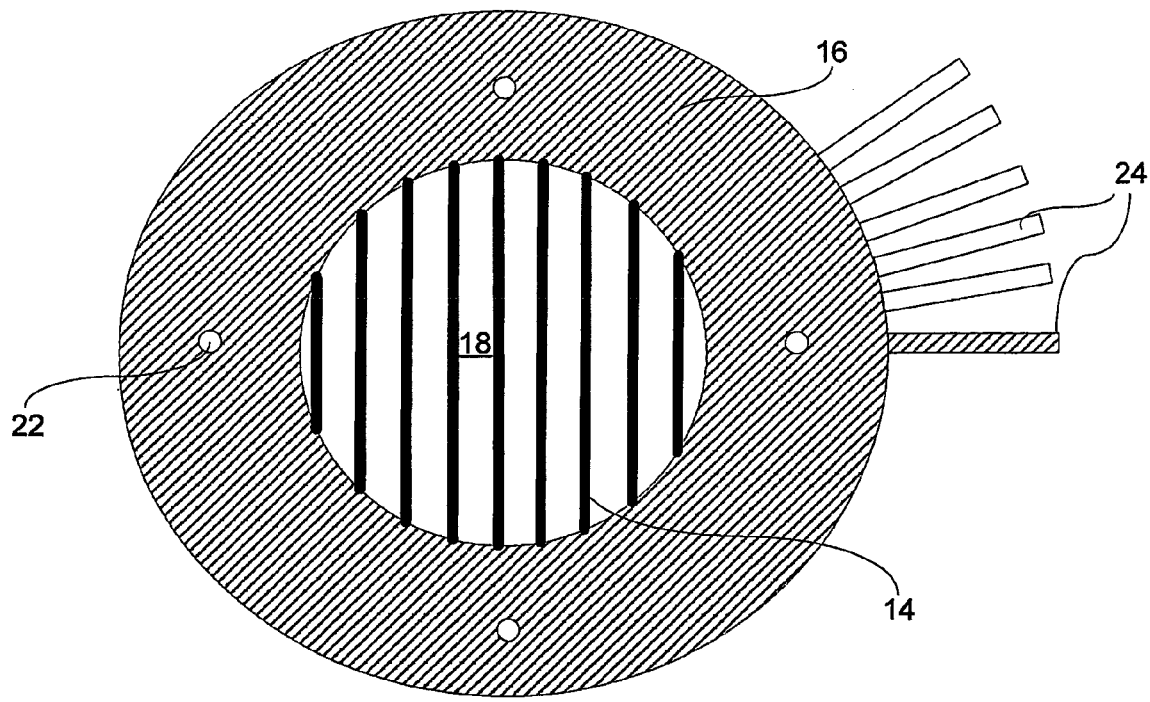
FIG. 7C is a schematic illustration of an end view of the stacked grid pattern shown in FIG. 7A.

FIG. 7C is a schematic illustration of an end view of the stacked grid pattern shown in FIG. 7A. The electrodes 14 on each layer are electrically connected to a trace 24 extending beyond the insulating substrate 16. The protruding traces 24 may be axially staggered as shown in FIG. 5C so that they do not touch each other if bent along the side of the stacked grids. The traces 24 could then be electrically connected to a contact hub (not shown) at one end of the stacked grid assembly where each trace 24 could be independently powered. Alternatively the traces 24 could be directly soldered to a common ring substrate.

The above therefore discloses a gating grid for deflecting ions and a method of producing such grids. Alterations, modifications, and improvements of the detailed disclosure above will readily occur to those skilled in the art. Such alterations, modifications, and improvements as are made obvious by this disclosure are intended to be included in this disclosure though not expressly stated herein, and are intended to be within the spirit and scope of the present invention. Accordingly, the foregoing description is by way of example only, and not limiting. The invention is limited only as defined in the following claims and equivalents thereto.

We claim:

1. A gating grid for deflecting ions, comprising:
   an insulting substrate;
   a conducting layer adhered to said insulating substrate; and
   interdigitated electrodes patterned in said conducting layer by a photolithographic process;
   said insulating substrate having a hole beneath said interdigitated electrodes, whereby ions may pass between said interdigitated electrodes and through said hole.

2. The gating grid as recited in claim 1, wherein said insulating substrate comprises Kapton®.

3. The gating grid as recited in claim 1, wherein said conducting layer comprises copper.

4. The gating grid as recited in claim 1, further comprising a reinforcing layer adhered to said insulating substrate.

5. The gating grid as recited in claim 4, wherein said reinforcing layer comprises ceramic.

6. The gating grid as recited in claim 1, further comprising a reinforcing layer adhered to said electrodes whereby the bending strength of said electrodes is increased.

7. The gating grid as recited in claim 1, further comprising electrical contact pads patterned in said conducting layer.

8. The gating grid as recited in claim 1, wherein said interdigitated electrodes are spaced less than 75 $\mu$m apart.

9. The gating grid as recited in claim 1, further comprising:
   a second insulting substrate;
   a second conducting layer adhered to said second insulating substrate; and
   second interdigitated electrodes patterned in said second conducting layer by a photolithographic process;
   said second insulating substrate defining a second hole therein beneath said second interdigitated electrodes, whereby ions may pass between said second interdigitated electrodes and through said second hole; and
   wherein said second hole is axially aligned with said first hole.

10. The gating grid as recited in claim 9, wherein said first interdigitated electrodes are axially aligned with said second interdigitated electrodes.

11. The gating grid as recited in claim 9, wherein said first interdigitated electrodes are not axially aligned with said second interdigitated electrodes.

12. A process for making a gating grid for deflecting ions, comprising the steps of:
   a) adhering a conducting layer to an insulating substrate;
   b) forming interdigitated electrodes by etching said conducting layer; and
   c) forming a hole through said insulating substrate beneath said interdigitated electrodes.

13. The process for making a gating grid as recited in claim 12, wherein said conducting layer comprises copper and said insulating substrate comprises Kapton®.

14. The process for making a gating grid as recited in claim 12, wherein said step of forming interdigitated electrodes on said conducting layer comprises the steps of:
   b1) applying photoresist to said conducting layer;
   b2) patterning said electrodes in said photoresist using photolithography; and
   b3) etching said conducting layer.

15. The process for making a gating grid as recited in claim 12, wherein the step of forming a hole in said insulating substrate beneath said interdigitated electrodes further comprises the steps of:
   c1) applying a masking layer to said insulating substrate;
   c2) patterning said hole in said masking layer using photolithography;
   c3) etching said insulating substrate.

16. The process for making a gating grid as recited in claim 12, further comprising the step of attaching a reinforcing layer to said insulating substrate.

17. The process for making a gating grid as recited in claim 12, further comprising the step of stacking a plurality of gating grids together.

18. The process for making a gating grid as recited in claim 17, wherein said electrodes from said plurality of gating grids are not axially aligned.

19. The process for making a gating grid as recited in claim 12, further comprising the step of:
   (d) applying a metallic top layer to said electrodes whereby the bending strength of said electrodes is increased.

* * * * *